United States Patent
Yun et al.

(10) Patent No.: US 9,837,629 B2
(45) Date of Patent: Dec. 5, 2017

(54) ORGANIC LIGHT EMITTING DIODE DISPLAY

(71) Applicant: Samsung Display Co., Ltd., Yongin-si (KR)

(72) Inventors: Hae Young Yun, Suwon-si (KR); Jun Young Kim, Asan-si (KR); Jung-Hyun Cho, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 50 days.

(21) Appl. No.: 14/982,417

(22) Filed: Dec. 29, 2015

(65) Prior Publication Data

US 2017/0005286 A1    Jan. 5, 2017

(30) Foreign Application Priority Data

Jul. 2, 2015   (KR) .................. 10-2015-0094718

(51) Int. Cl.
*H01L 51/52*   (2006.01)
*H01L 27/32*   (2006.01)

(52) U.S. Cl.
CPC ...... *H01L 51/5209* (2013.01); *H01L 27/3211* (2013.01); *H01L 51/5225* (2013.01)

(58) Field of Classification Search
CPC ............. H01L 27/3246; H01L 27/322; H01L 27/3211; H01L 27/3244; H01L 51/5209;
(Continued)

(56) References Cited

U.S. PATENT DOCUMENTS

2008/0122347 A1   5/2008  Lee
2010/0060148 A1*  3/2010  Hwang ............... H01L 27/3213
                                                  313/504

(Continued)

FOREIGN PATENT DOCUMENTS

JP    2008-235605     10/2008
KR   10-2011-0132816  12/2011
(Continued)

OTHER PUBLICATIONS

Merriam-Webster, Surround definition, Searched Apr. 6, 2017, pp. 1-13.*

*Primary Examiner* — Eliseo Ramos Feliciano
*Assistant Examiner* — Joannie A Garcia
(74) *Attorney, Agent, or Firm* — H.C. Park & Associates, PLC

(57) ABSTRACT

An organic light emitting diode display including a substrate, a first electrode disposed on the substrate, a second electrode disposed on the substrate and separated from the first electrode, a pixel defining layer disposed on the first electrode and the second electrode, a first organic emission layer disposed on the first electrode corresponding to the first opening, a second organic emission layer disposed on the second electrode corresponding to the second opening, and a common electrode disposed on the first organic emission layer and the second organic emission layer. The first electrode includes a first dent portion. The second electrode includes a second dent portion having a different size from the first dent portion. The pixel defining layer includes a first opening exposing the first electrode corresponding to the first dent portion and a second opening exposing the second electrode corresponding to the second dent portion.

19 Claims, 15 Drawing Sheets

(58) Field of Classification Search
CPC . H01L 51/5203; H01L 27/3276; H01L 27/32; H01L 27/3283; H01L 2251/5315; H01L 27/326; H01L 51/5012; H01L 51/5225; H01L 2251/5338; H01L 27/3218; H01L 29/78603; H01L 2251/558; H01L 25/0753; H01L 29/45; H01L 33/38; H01L 51/0002; H01L 51/0097
See application file for complete search history.

(56) References Cited

U.S. PATENT DOCUMENTS

| | | |
|---|---|---|
| 2011/0297943 A1 | 12/2011 | Kim et al. |
| 2013/0001603 A1* | 1/2013 | Lim .................... H01L 51/5209 257/88 |
| 2014/0151651 A1 | 6/2014 | Jin et al. |
| 2014/0339514 A1 | 11/2014 | Oh et al. |

FOREIGN PATENT DOCUMENTS

| | | |
|---|---|---|
| KR | 10-1326135 | 11/2013 |
| KR | 10-2014-0072711 | 6/2014 |
| KR | 10-2014-0135560 | 11/2014 |

\* cited by examiner

ORGANIC LIGHT EMITTING DIODE DISPLAY

CROSS-REFERENCE TO RELATED APPLICATIONS

This application claims priority from and the benefit of Korean Patent Application No. 10-2015-0094718, filed on Jul. 2, 2015, which is hereby incorporated by reference for all purposes as if fully set forth herein.

BACKGROUND

Field

Exemplary embodiments relate to an organic light emitting diode display.

Discussion of the Background

Organic light emitting diode (OLED) displays have a self-luminance characteristic and do not require a separate light source unlike liquid crystal display (LCD) devices. Thus, OLED displays may have reduced thickness and weight. Further, OLED displays have low power consumption, high luminance, and a high reaction speed when compared to LCD devices.

In general, the OLED display includes a first electrode, an organic emission layer, and a second electrode that are sequentially stacked. Conventionally, OLED displays have different distances between the first electrode and the second electrode according to a viewing angle to generate a color shift of the light emitted by the organic emission layer.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting diode display for controlling a color shift of light emitted by an organic emission layer.

Exemplary embodiments also provide an organic light emitting diode display for improving efficiency of light emitted by an organic emission layer.

Exemplary embodiments further provide an organic light emitting diode display for controlling deterioration of efficiency of light emitted by an organic emission layer when a process error occurs.

Additional aspects will be set forth in the detailed description which follows, and, in part, will be apparent from the disclosure, or may be learned by practice of the inventive concept.

An exemplary embodiment discloses an organic light emitting diode display including a substrate, a first electrode disposed on the substrate, a second electrode disposed on the substrate and separated from the first electrode, a pixel defining layer disposed on the first electrode and the second electrode, a first organic emission layer disposed on the first electrode corresponding to the first opening, a second organic emission layer pro disposed vided on the second electrode corresponding to the second opening, and a common electrode disposed on the first organic emission layer and the second organic emission layer. The first electrode includes a first dent portion. The second electrode includes a second dent portion having a different size from the first dent portion. The pixel defining layer includes a first opening exposing the first electrode corresponding to the first dent portion and a second opening exposing the second electrode corresponding to the second dent portion.

An exemplary embodiment discloses an organic light emitting diode display including a substrate, a first electrode disposed on the substrate, a pixel defining layer disposed on the first electrode, an organic emission layer disposed on the first electrode corresponding to the opening, and a second electrode disposed on the organic emission layer. The first electrode includes a dent portion with a curved side. The pixel defining layer includes an opening for exposing the first electrode corresponding to the dent portion.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
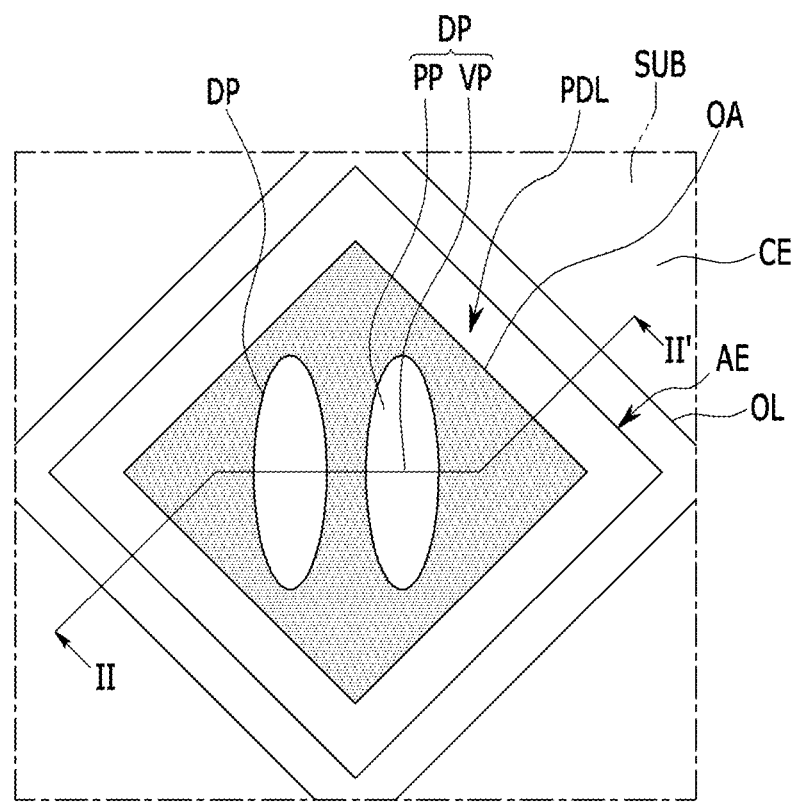
FIG. 1 is a plan view of an OLED display according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
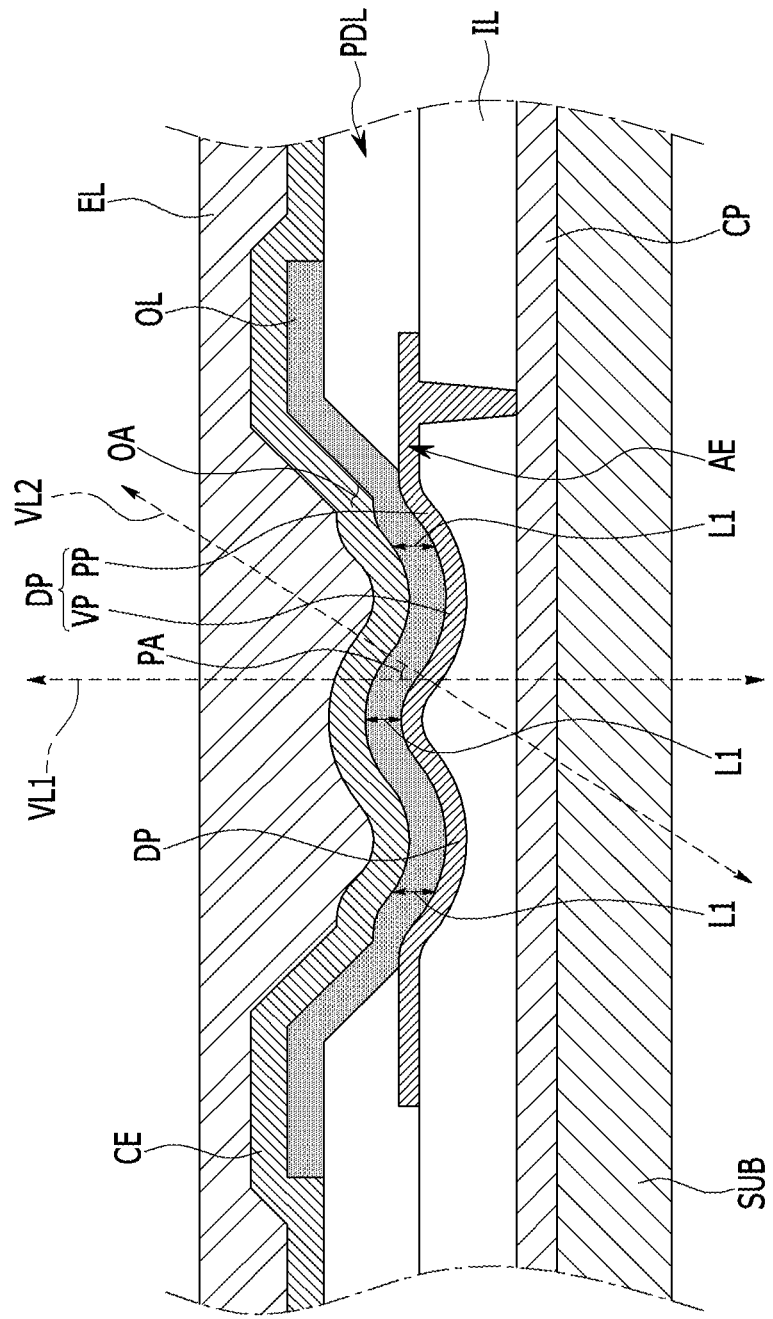
FIG. 2 is a cross-sectional view taken along section line II-II' of FIG. 1.

FIG. 1 is a plan view of an OLED display according to an exemplary embodiment. FIG. 2 is a cross-sectional view taken along section line II-II' of FIG. 1.

As shown in FIG. 1 and FIG. 2, the OLED display according to an exemplary embodiment includes a substrate SUB, a circuit portion CP, an insulating layer IL, a first electrode AE, a pixel defining layer PDL, an organic emission layer OL, a common electrode CE, and an encapsulation layer EL.

The substrate SUB may be an insulating substrate that includes at least one of glass, polymer, and stainless steel. The substrate SUB may be flexible, stretchable, foldable, bendable, and/or rollable. Therefore, the OLED display may be flexible, stretchable, foldable, bendable, and/or rollable.

The circuit portion CP is provided or otherwise disposed on the substrate SUB. The circuit portion CP may include a pixel circuit including a wire, a plurality of thin film transistors (TFTs) connected to the wire corresponding to one pixel, and at least one capacitor. The wire may include at least a scan line, a data line, a driving power line, and a common power line. The circuit portion CP may be formed to have various configurations that are well-known to a person skilled in the art. The pixel may signify a minimum unit for displaying an image. A size of the pixel may correspond to a size of an opening formed in the pixel defining layer. However, exemplary embodiments are not limited to the size of the pixel corresponding to the size of an opening formed in the pixel defining layer.

The insulating layer IL may be provided between the substrate SUB and the first electrode AE. In particular the insulating layer IL may be provided between the circuit portion CP and the first electrode AE. The first electrode AE may be connected to the circuit portion CP through a contact hole formed in the insulating layer IL. The insulating layer IL may include a dented portion corresponding to a dent portion DP of the first electrode AE. The first electrode AE may include a dent portion DP corresponding to the dented portion of the insulating layer IL. The insulating layer IL may have a single-layered or multi-layered configuration including at least one of an inorganic material and an organic material. The inorganic material may include a silicon nitride and/or a silicon oxide.

The first electrode AE may be provided on the circuit portion CP and may be connected to a thin film transistor of the circuit portion CP. A center region of the first electrode AE may be opened by an opening OA of the pixel defining layer PDL. The first electrode AE may be an anode electrode functioning as a hole injecting electrode or a cathode electrode functioning as an electron injecting electrode. The first electrode AE may be formed to be an optical transmissible electrode or an optical reflective electrode.

The first electrode AE may include a dent portion DP that is dented with a curved side corresponding to a dented portion of the insulating layer IL. Although FIG. 2 illustrates multiple dent portions DP (e.g., two dent portions DP), exemplary embodiments are not limited to multiple dent portions DP and may instead include a single dent portion DP. The dent portion DP may include a valley portion VP corresponding to a lowest portion and a peak portion PP corresponding to a highest portion. The peak portion PP may extend from the valley portion VP to the edge of the dent portion DP and/or the valley portion VP of an adjacent dent portion DP. The peak portion PP may surround the valley portion VP. A surface from the valley portion VP to the peak portion PP may form a curved side of the dent portion DP. As shown in FIG. 2, the curved side of the dent portion DP may have a sine wave cross-sectional shape. The sine wave cross-sectional shape may signify a line that is bent and extended in a curve shape without a corner.

The entire surface of the dent portion DP may be formed to be the above-noted curved side.

The pixel defining layer PDL may be provided on the first electrode AE and may cover an edge of the first electrode AE. In particular, the pixel defining layer PDL may cover respective ends of the first electrode AE. In other words, the pixel defining layer PDL may cover an external portion of the first electrode AE. A surface of the external portion of the first electrode AE covered by the pixel defining layer PDL may extend in parallel to a plate side of the substrate SUB.

The pixel defining layer PDL may include an opening OA for exposing the center region of the first electrode AE in which the dent portion DP is formed. In other words, the opening OA of the pixel defining layer PDL opens the first electrode AE corresponding to the dent portion DP. From a plan view perspective, the opening OA of the pixel defining layer PDL may be polygonal. The opening OA of the pixel defining layer PDL may have various shapes such as a quadrangle, a triangle, a pentagon, a hexagon, a heptagon, or an octagon.

An organic emission layer OL for emitting light may be provided on the first electrode AE exposed through the opening OA of the pixel defining layer PDL as well as the pixel defining layer PDL.

Although not shown, the organic emission layer OL may pass through the first electrode AE corresponding to the opening OA and may be provided on the pixel defining layer PDL. However, exemplary embodiments (as shown in FIG. 2 include the organic emission layer (OL) provided on the first electrode AE) corresponding to the opening OA.

The organic emission layer OL may be formed on the first electrode AE by using a deposition process using a mask. The organic emission layer OL may be formed to generally have a uniform thickness, so a distance from the entire surface of the first electrode AE to the common electrode CE in a first imaginary line VL1 direction that is a direction perpendicular to the plate side of the substrate SUB has a uniform first distance L1.

Further, the first electrode AE may include the dent portion DP having a curved side so the polar angle PA (i.e., an angle of intersection between a first imaginary line VL1 that is a normal line that is perpendicular to a plate side of the substrate SUB and a second imaginary line VL2 that is a normal line perpendicular to a curved side of the dent portion DP) may have an angle of 0 to 30 degrees.

The organic emission layer OL may include an organic material for emitting red, blue, green, and/or white light. Part of the organic emission layer OL provided in the opening OA to contact the first electrode AE may emit red, blue, green, and/or white light.

The common electrode CE may be provided on the organic emission layer OL and the pixel defining layer PDL. The common electrode CE may be provided over the entire surface of the substrate SUB. The common electrode CE may be a cathode electrode functioning as an electron injecting electrode or an anode electrode functioning as a hole injecting electrode. The common electrode CE may be formed to be an optical transmissible electrode or an optical semi-transmissible electrode.

An encapsulation layer (EL) may cover the common electrode CE. The encapsulation layer EL may encapsulate the first electrode AE, the organic emission layer OL, and the common electrode CE together with a substrate SUB. The encapsulation layer EN may be formed by stacking at least one organic layer and at least one inorganic layer.

Figure 3:
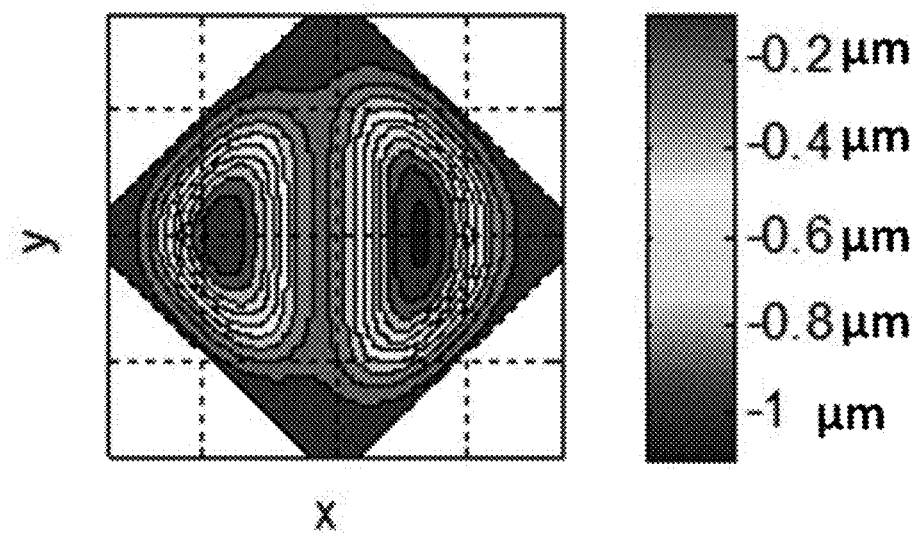
FIG. 3 illustrates a contour of a dent portion of an OLED display according to an exemplary embodiment.

FIG. 3 illustrates a contour of a dent portion of an OLED display according to an exemplary embodiment.

As shown in FIG. 3, the dent portion of an OLED display according to an exemplary embodiment is dented in a three-dimensional (3D) shape. The illustrated dent portion has a valley portion with a depth of about 1 µm and a peak portion with a depth of about 0.2 µm. The illustrated dent portion gradually increases in depth from the peak portion of about 0.2 µm to about 1 µm. The dent portion may include a curved side without a corner.

A depth of the dent portion is not limited to the above-described numerical range. Instead, the depth of the dent portion have a minimum depth at the peak portion of about 0.2 µm or less and a maximum depth of about 1 µm or more.

Figure 4:
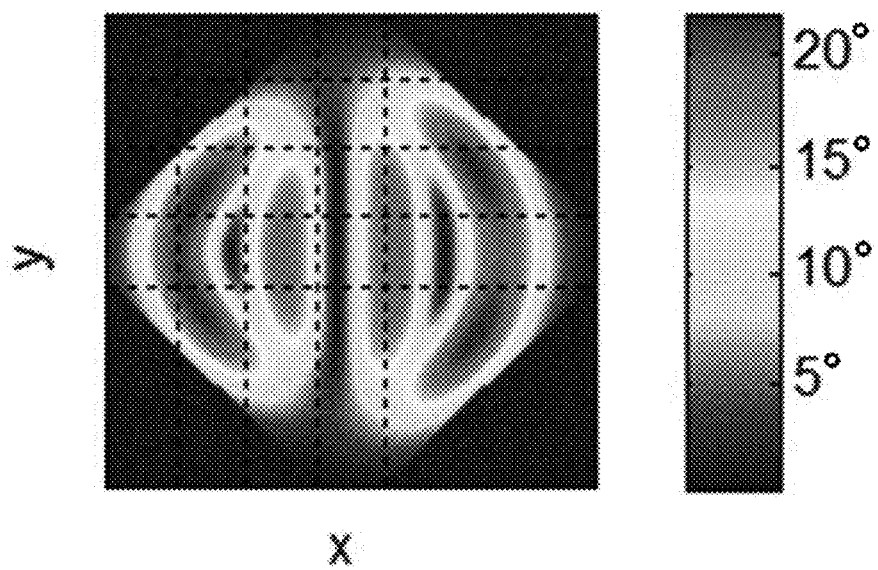
FIG. 4 illustrates a distribution of a polar angle of a dent portion of an OLED display according to an exemplary embodiment.

FIG. 4 illustrates a distribution of a polar angle of a dent portion of an OLED display according to an exemplary embodiment. Here, the polar angle may be the same polar angle as described with reference to FIG. 2.

As shown in FIG. 4, the dent portion of an OLED display according to an exemplary embodiment forms different polar angles of from about 0 to about 20 degrees from the peak portion to the valley portion.

The polar angle formed by the dent portion is not limited to the above-described numerical range. Instead, the polar angle may be less than or equal to 0 degrees and may be greater than or equal to 20 degrees. In an exemplary embodiment, the polar angle may be formed to be about 0 to about 30 degrees.

According to an exemplary embodiment, the dent portion DP of the first electrode AE may include a curved side dented in a 3D shape without a corner. A distance between the common electrode CE and the entire surface of the first electrode AE may have a uniform first distance L1, so the distance between the first electrode AE facing the viewing angle and the common electrode CE is constant, thereby controlling the generation of a color shift to the light emitted by the organic emission layer OL.

According to an exemplary embodiment, the dent portion DP of the first electrode AE may include a curved side dented in a 3D shape without a corner. A distance between the common electrode CE and the entire surface of the first electrode AE may have a uniform first distance L1, so the entire surface area of the organic emission layer OL is increased corresponding to the dent portion DP of the first electrode AE. Light emitted by the organic emission layer OL may be reflected in various directions by the dent portion DP of the first electrode AE thereby improving emission efficiency of light emitted by the organic emission layer OL.

Further, according to an exemplary embodiment, the dent portion DP of the first electrode AE may include a curved side dented in a 3D shape without a corner. A distance between the common electrode CE and the entire surface of the first electrode AE may have a uniform first distance L1, so when the area of the opening OA is reduced through a processing error, the entire surface area of the organic emission layer OL is increased corresponding to the dent portion DP of the first electrode AE. Light emitted by the organic emission layer OL is reflected in various directions by the dent portion DP of the first electrode AE, thereby controlling deterioration of optical efficiency of the light emitted by the organic emission layer OL caused by a processing error.

In addition, according to an exemplary embodiment, the surface of the external portion of the first electrode AE covered by the pixel defining layer PDL may extend in parallel to the plate side of the substrate SUB. Thus, when part of the pixel defining layer PDL neighboring the opening OA moves to a portion that is close to the dent portion DP through the processing error, the pixel defining layer PDL is controlled to cover the dent portion DP. In other words, the dent portion DP is controlled to be provided on the edge of the opening OA, thereby controlling the generation of a color shift of the light that is visible through the opening OA from the organic emission layer OL.

Also, according to an exemplary embodiment, the OLED display includes a flexible substrate SUB so the organic light emitting diode display may be flexible. As described, the OLED display is flexible, so when the organic light emitting diode display is bent and the viewing angle is changed. The dent portion DP of the first electrode AE may include a curved side dented in a 3D shape without a corner and the gap between the entire surface of the first electrode AE and the common electrode CE may have a constant first distance L1. The distance between the first electrode AE facing the viewing angle and the common electrode CE may be maintained to control the generation of a color shift to the light emitted by the organic emission layer OL.

Although flexible, the OLED display improves the overall display quality.

An OLED display according to an exemplary embodiment will now be described with reference to FIG. 5, FIG. 6, and FIGS. 7A-7D. For brevity and clarity, the description of FIGS. 5-7D will focus on the differences between the OLED display of FIGS. 1-4 and FIGS. 5-7D.

Figure 5:
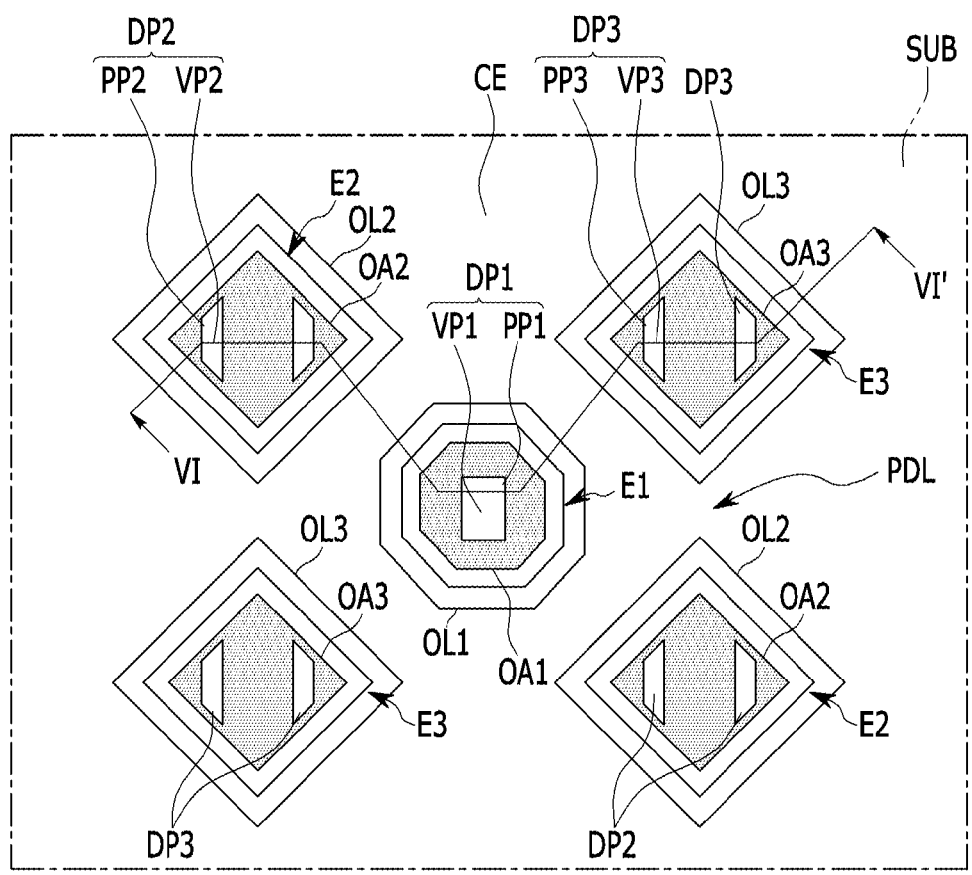
FIG. 5 is a plan view of an OLED display according to an exemplary embodiment.
Figure 6:
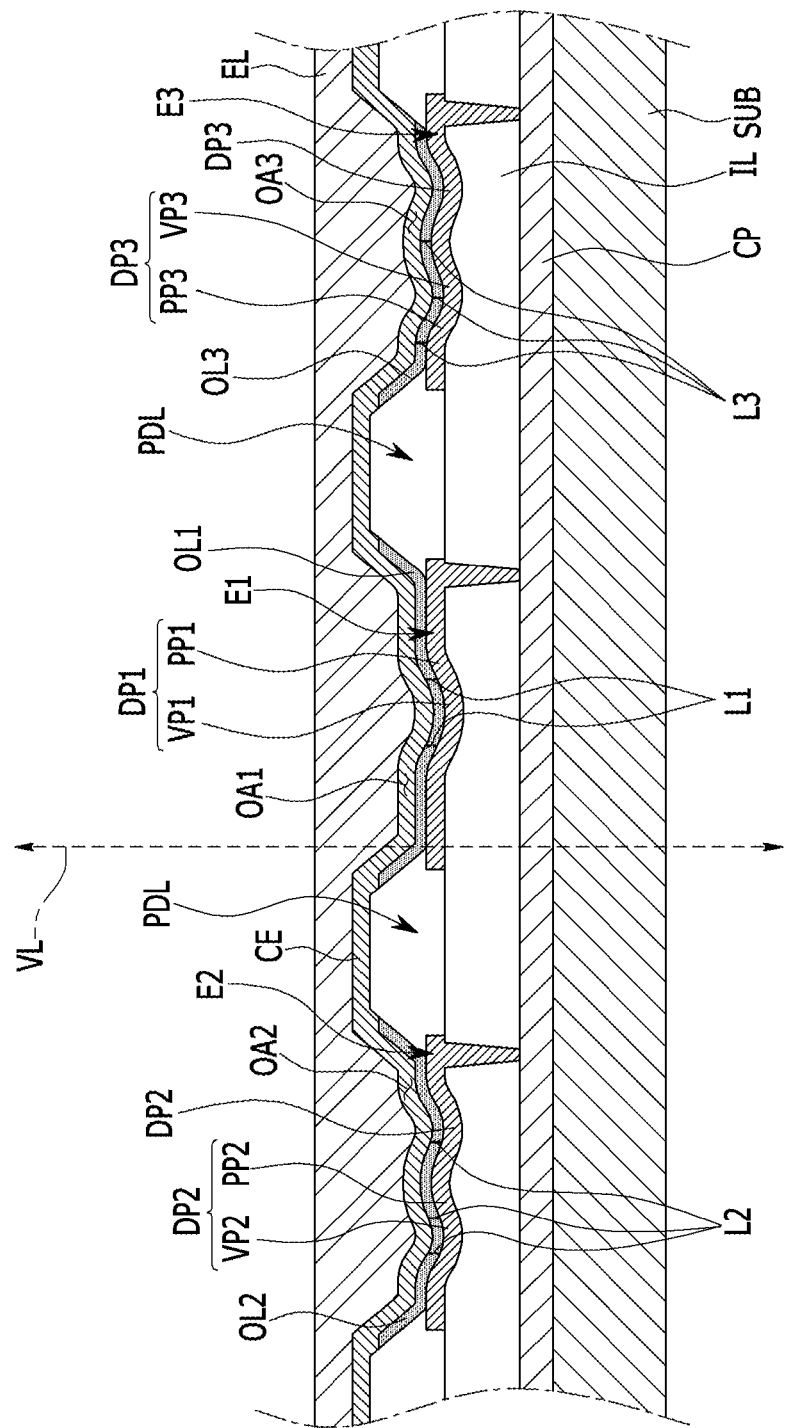
FIG. 6 is a cross-sectional view taken along section line VI-VI' of FIG. 5.

FIG. 5 is a plan view of an OLED display according to an exemplary embodiment. FIG. 6 is a cross-sectional view taken along sectional line VI-VI' of FIG. 5.

As shown in FIG. 5 and FIG. 6, the OLED display according to an exemplary embodiment includes a substrate SUB, a circuit portion CP, an insulating layer IL, a first electrode E1, a second electrode E2, a third electrode E3, a pixel defining layer PDL, a first organic emission layer OL1, a second organic emission layer OL2, a third organic emission layer OL3, a common electrode CE, and an encapsulation layer EL.

The insulating layer IL may be provided between the substrate SUB and each of the first electrode E1, the second electrode E2, and the third electrode E3. More specifically, the insulating layer IL may be provided between the circuit portion CP and the first electrode E1, between the circuit portion CP and the second electrode E2, and between the circuit portion CP and the third electrode E3. Each of the first electrode E1, the second electrode E2, and the third electrode E3 may be connected to the circuit portion CP through a contact hole formed in the insulating layer IL. In other words, the insulating layer IL may include three contact holes corresponding to parts of each electrode E1, E2, and E3. The insulating layer IL may include a dented portion corresponding to a first dent portion DP1 of the first electrode E1, a second dent portion DP2 of the second electrode E2, and a third dent portion DP3 of the third electrode E3. The first electrode E1, the second electrode E2, and the third electrode E3 may include a first dent portion DP1, a second dent portion DP2, and a third dent portion DP3 corresponding to the dented portions of the insulating layer IL. The insulating layer IL may have a single-layered or multiple layers. The insulating layer IL may include an inorganic material, such as silicon nitride and/or an silicon oxide. Alternatively or in addition, the insulating layer may include an organic material.

The first electrode E1 may be provided on a circuit portion CP of the substrate SUB. The first electrode E1 may be connected to a thin film transistor of the circuit portion CP. A center region of the first electrode E1 may be exposed by a first opening OA1 of the pixel defining layer PDL. The first electrode E1 may be an anode electrode functioning as a hole injecting electrode or a cathode electrode functioning as an electron injecting electrode. The first electrode E1 may be formed to be an optical transmissible electrode or an optical reflective electrode.

The first electrode E1 may include a first dent portion DP1 that is dented with a curved side corresponding to a dented portion of the insulating layer IL. One first dent portion DP1 corresponding to the first electrode E1 is shown. However, exemplary embodiments may include multiple dent portions DP1 corresponding to the first electrode E1. The first dent portion DP1 may include a first valley portion VP1 corresponding to a lowest portion and a first peak portion PP1 corresponding to a highest portion. The first peak portion PP1 may extend from the first valley portion VP1 to the edge of the dent portion DP1 and may surround the first valley portion VP1. A surface from the first valley portion VP1 to the first peak portion PP1 may form a curved side. The curved side of the first dent portion DP1 may be a surface of the first dent portion DP1. As shown in FIG. 6, the curved side of the first dent portion DP1 may have a sine wave cross-sectional shape. Here, the sine wave cross-sectional shape may signify a line that is bent and extended in a curved shape without a corner. The entire surface of the first dent portion DP1 may be formed to be the above-noted curved side.

The second electrode E2 may be provided on the circuit portion CP of the substrate SUB and may be separated from the first electrode E1. The second electrode E2 may be connected to a thin film transistor of the circuit portion CP. A center region of the second electrode E2 may be exposed by a second opening OA2 of the pixel defining layer PDL. The second electrode E2 may be an anode electrode functioning as a hole injecting electrode or a cathode electrode functioning as an electron injecting electrode. The second electrode E2 may be formed to be an optical transmissible electrode or an optical reflective electrode.

The second electrode E2 may include a second dent portion DP2 that is dented with a curved side corresponding to a dented portion of the insulating layer IL As illustrated in FIG. 6, the second dent portion DP2 may include more than one dent portion. However, exemplary embodiments may include the second dent portion DP2 including only one dent portion or more than two dent portions. The multiple dent portions DP2 may be separated from each other. The second dent portion DP2 may include a second valley portion VP2 corresponding to a lowest portion and a second peak portion PP2 corresponding to a highest portion. The second peak portion PP2 may extend from the second valley portion VP2 to the edge of the second dent portion DP2 and/or the second valley portion VP2 of an adjacent second dent portion DP2. The second peak portion PP2 may surround the second valley portion VP2. A surface from the second valley portion VP2 to the second peak portion PP2 may form a curved side. A curved side of the second dent portion DP2 may be a surface of the second dent portion DP2. As shown in FIG. 6, the curved side of the second dent portion DP2 may have a sine wave cross-sectional shape. Here, the sine wave cross-sectional shape may signify a line that is bent and extended in a curved shape without a corner. The entire surface of the second dent portion may be formed to be the above-noted curved side.

The second dent portion DP2 of the second electrode E2 may have a different size from the first dent portion DP1 of the first electrode E1. More specifically, the first dent portion DP1 may have a smaller area and/or a smaller volume than the second dent portion DP2.

The third electrode E3 may be provided on the circuit portion CP of the substrate SUB and may be separated from the first electrode E1 and the second electrode E2. The third electrode E3 may be connected to the thin film transistor of the circuit portion CP. A center region of the third electrode E3 is exposed by a third opening OA3 of the pixel defining layer PDL. The third electrode E3 may be an anode electrode functioning as a hole injecting electrode or a cathode electrode functioning as an electron injecting electrode. The third electrode E3 may be formed to be an optical transmissible electrode or an optical reflective electrode.

The third electrode E3 may include a third dent portion DP3 that is dented with a curved side corresponding to a dented portion of the insulating layer IL. Although multiple third dent portions DP3 are shown, exemplary embodiments may include one third dent portion DP3. The multiple third dent portions DP3 may be separated from each other. A third dent portion DP3 may include a third valley portion VP3 corresponding to a lowest portion and a third peak portion PP3 corresponding to a highest portion. The third peak portion PP3 may extend from the third valley portion VP3 to the edge of the third dent portion DP3 and/or the third valley portion VP3 of an adjacent third dent portion DP3. The third peak portion PP3 may surround the third valley portion VP3. A surface from the third valley portion VP3 to the third peak portion PP3 may form a curved side. The curved side of the third dent portion DP3 may be a surface of the third dent portion DP3. As shown in FIG. 6, the curved side of the third dent portion DP3 may have a sine wave cross-sectional shape. Here, the sine wave cross-sectional shape may signify a line that is bent and extended in a curved shape without a corner. The entire surface of the third dent portion DP3 may be formed to be the above-noted curved side.

The third dent portion DP3 of the third electrode E3 may have a different size from the first dent portion DP1 of the first electrode E1. More specifically, the first dent portion DP1 may have a smaller area and/or a smaller volume than the third dent portion DP3.

The pixel defining layer PDL may be provided on the first electrode E1, the second electrode E2, and the third electrode E3. The pixel defining layer PDL may cover the respective edges of the first electrode E1, the second electrode E2, and the third electrode E3. More specifically, the pixel defining layer PDL may cover respective ends of the first electrode E1 (i.e., an external portion of the first electrode E1), respective ends of the second electrode E2, (i.e., an external portion of the second electrode E2), and respective ends of the third electrode E3 (i.e., an external portion of the third electrode E3). Surfaces of the respective external portions of the first electrode E1, the second electrode E2, and the third electrode E3 covered by the pixel defining layer PDL may extend in parallel with the plate side of the substrate SUB The pixel defining layer PDL may include a first opening OA1 for exposing a center region of the first electrode E1 in which the first dent portion DP1 is formed. The pixel defining layer PDL may include a second opening OA2 for exposing a center region of the second electrode E2 in which the second dent portion DP2 is formed. The pixel defining layer PDL may include a third opening OA3 for exposing a center region of the third electrode E3 in which the third dent portion DP3 is formed. In other words, the first opening OA1, the second opening OA2, and the third opening OA3 of the pixel defining layer PDL expose the first electrode E1, the second electrode E2, and the third electrode E3 corresponding to the first dent portion DP1, the second dent portion DP2, and the third dent portion DP3. From a plan view, the first opening OA1, the second opening OA2, and the third opening OA3 of the pixel defining layer PDL may have a polygonal shape. For example, at least one of the first opening OA1, the second opening OA2, and the third opening OA3 may have a plan view shape of one of a quadrangle, a triangle, a pentagon, a hexagon, a heptagon, and/or an octagon.

The first opening OA1 of the pixel defining layer PDL may have a different size from the second opening OA2 and the third opening OA3. More specifically, the first opening OA1 may have a smaller area and/or a smaller volume than the second opening OA2 and the third opening OA3.

A first organic emission layer OL1, a second organic emission layer OL2, and a third organic emission layer OL3 for emitting light may be provided on the exposed first electrode E1, second electrode E2, and third electrode E3 corresponding to the first opening OA1, the second opening OA2, and the third opening OA3 of the pixel defining layer PDL.

Although not shown, the first organic emission layer OL1, the second organic emission layer OL2, and the third organic emission layer OL3 may pass through the first electrode E1, the second electrode E2, and the third electrode E3 corresponding to the first opening OA1, the second opening OA2, and the third opening OA3 and may be provided on the pixel defining layer PDL. However, exemplary embodiments (as shown in FIG. 6) include the first organic emission layer OL1, the second organic emission layer OL2, and the third organic emission layer OL3 provided on the first electrode E1, the second electrode E2, and the third electrode E3 corresponding to the first opening OA1, the second opening OA2, and the third opening OA3.

The first organic emission layer OL1, the second organic emission layer OL2, and the third organic emission layer OL3 may be respectively formed on the first electrode E1, the second electrode E2, and the third electrode E3 using different deposition processes with different masks. The first organic emission layer OL1 may be formed to have a uniform thickness so the gap between the surface of the first electrode E1 and the common electrode CE along the imaginary line VL (i.e., a line that is perpendicular to the plate side of the substrate SUB) has a constant first distance L1. Also, the second organic emission layer OL2 may be formed to have a uniform thickness so the gap between the surface of the second electrode E2 and the common electrode CE along the imaginary line VL) direction has a constant second distance L2. Further, third organic emission layer OL3 may be formed to have a uniform thickness so the gap between the surface of the third electrode E3 and the common electrode CE in the imaginary line VL has a constant third distance L3.

The first organic emission layer OL1, the second organic emission layer OL2, and the third organic emission layer OL3 may emit light having different wavelengths. More specifically, the first organic emission layer OL1 may emit light with a first wavelength, the second organic emission layer OL2 may emit light with a second wavelength that is less than the first wavelength, and the third organic emission layer OL3 may emit light with a third wavelength that is greater than the first wavelength. For example, the first organic emission layer OL1 may include an organic material for emitting green light, the second organic emission layer OL2 may include an organic material for emitting blue light, and the third organic emission layer OL3 may include an organic material for emitting red light.

The common electrode CE may be provided on the first organic emission layer OL1, the second organic emission layer OL2, the third organic emission layer OL3, and the pixel defining layer PDL on the substrate SUB. The common electrode CE may be a cathode electrode functioning as an electron injecting electrode or an anode electrode functioning as a hole injecting electrode. The common electrode CE may be formed to be an optical transmissible electrode or an optical semi-transmissible electrode.

Forms of a first dent, a second dent, and a third dent of a first electrode, a second electrode, and a third electrode of an OLED display according to an exemplary embodiment will now be described with reference to FIG. 7A, FIG. 7B, FIG. 7C, and FIG. 7D.

Figure 7A:
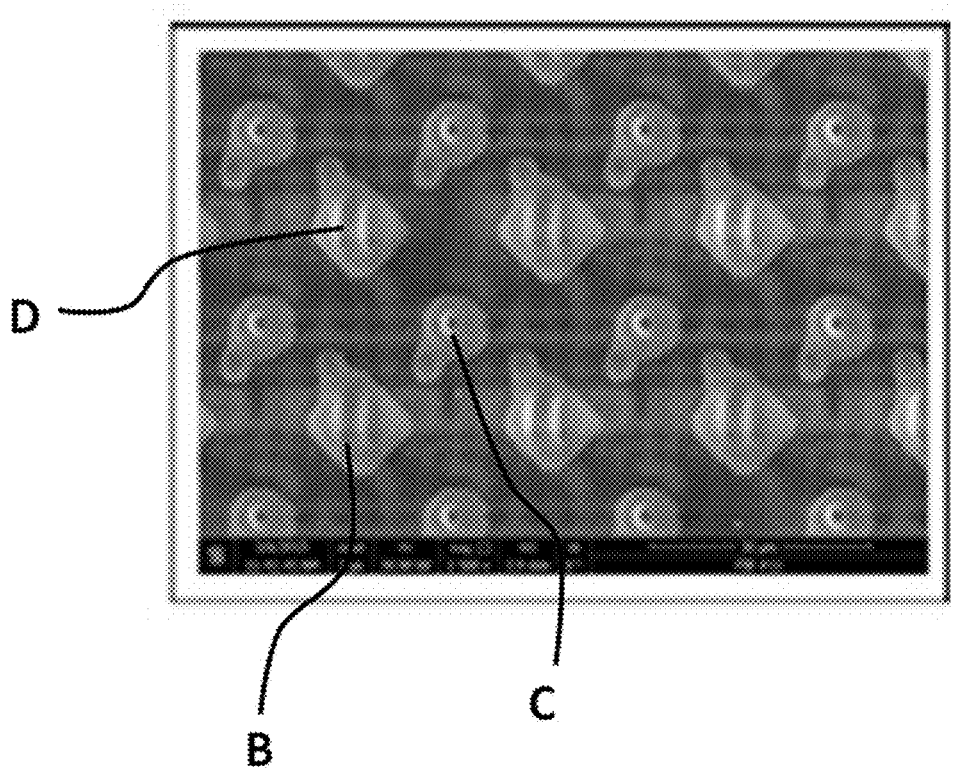
FIG. 7A is a photograph of a plan view of an OLED display according to an exemplary embodiment.
Figure 7B:
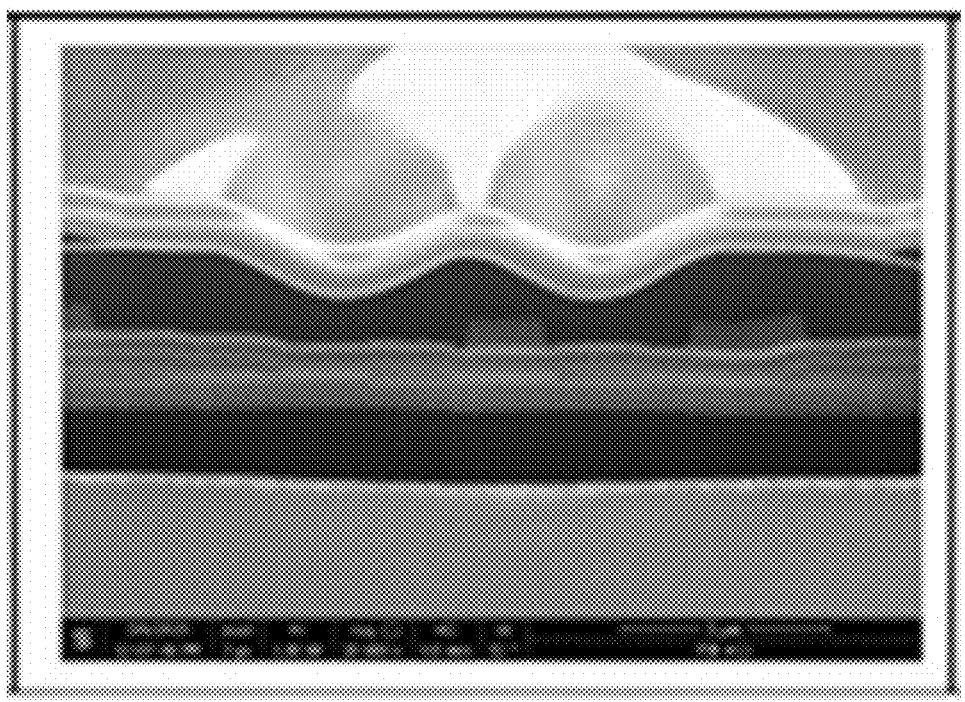
FIG. 7B is a photograph of a cross-section of B shown in FIG. 7A.
Figure 7C:
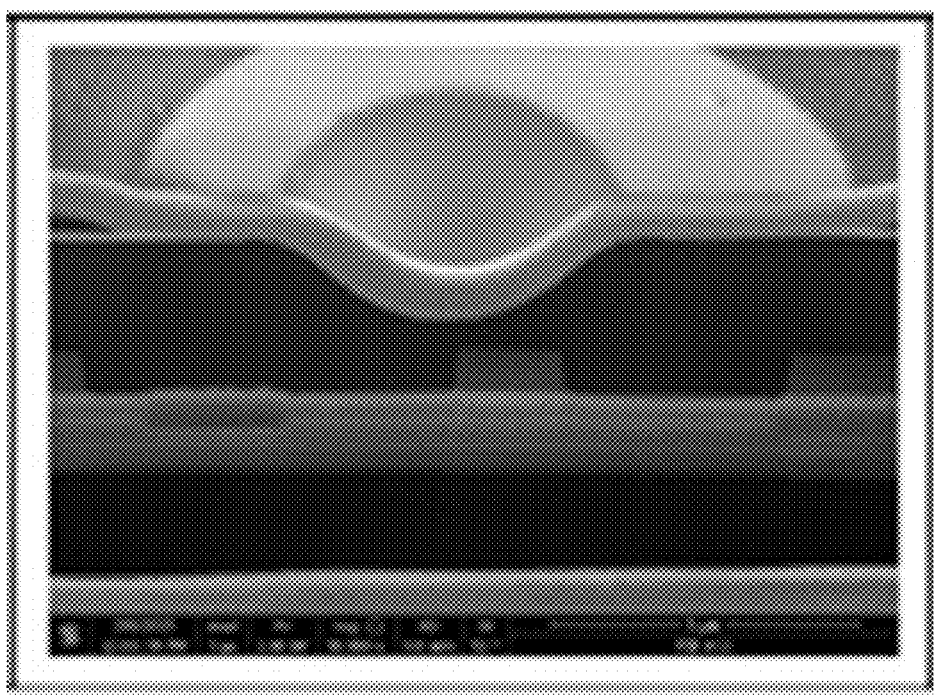
FIG. 7C is a photograph of a cross-section of C shown in FIG. 7A.
Figure 7D:
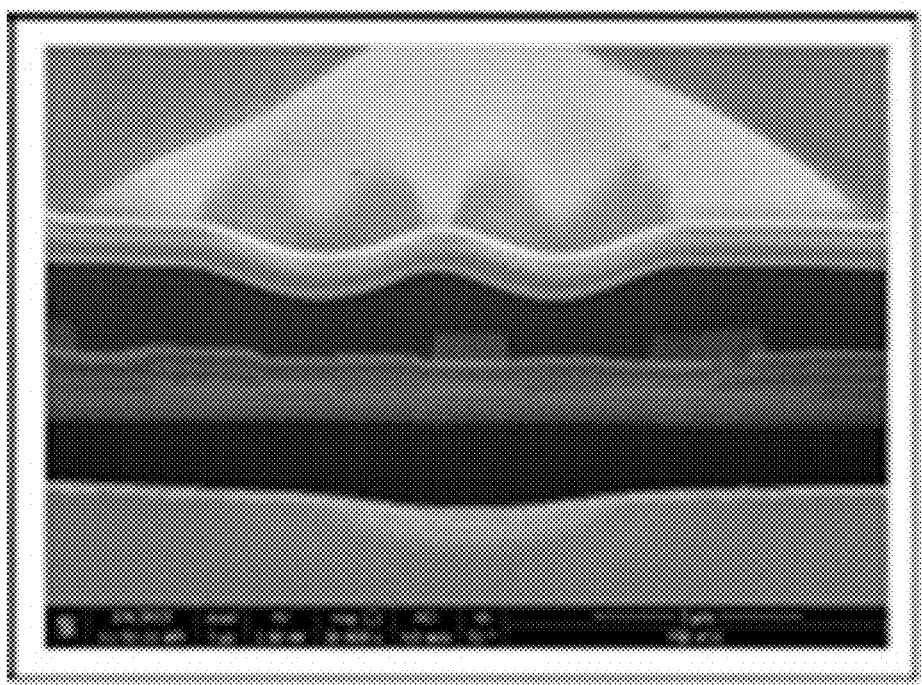
FIG. 7D is a photograph of a cross-section of D shown in FIG. 7A.

FIG. 7A is a photograph of a plan view of an OLED display according to an exemplary embodiment. FIG. 7B is a photograph of a cross-section of B shown in FIG. 7A. FIG. 7C is a photograph of a cross-section of C shown in FIG. 7A. FIG. 7D is a photograph of a cross-section of D shown in FIG. 7A. In FIG. 7A, B indicated a third electrode, C represents a first electrode, and D represents a second electrode.

As shown in FIG. 7A and FIG. 7C, the first dent portion of the first electrode of the OLED display according to an exemplary embodiment is dented in a 3D shape. In other words, the first dent portion may include a curved side dented in a 3D shape without a corner.

As shown in FIG. 7A and FIG. 7D, the second dent portion of the second electrode of the OLED display according to an exemplary embodiment is dented in a 3D shape. In other words, the second dent portion may include a curved side dented in a 3D shape without a corner.

As shown in FIG. 7A and FIG. 7B, the third dent portion of the third electrode of the OLED display according to an exemplary embodiment is dented in a 3D shape. In other words, the third dent portion may include a curved side dented in a 3D shape without a corner.

According to an exemplary embodiment, the first dent portion DP1, the second dent portion DP2, and the third dent portion DP3 of the first electrode E1, the second electrode E2, and the third electrode E3 respectively include a curved side dented in a 3D shape without a corner. The gap between the surface of the first electrode E1 and the common electrode CE may have a uniform first distance L1. The gap between the surface of the second electrode E2 and the common electrode CE may have a uniform second distance L2. The gap between the entire surface of the third electrode E3 and the common electrode CE may have a uniform third distance L3. The distance between the first electrode E1 facing the viewing angle and the common electrode CE, the distance between the second electrode E2 and the common electrode CE, and the distance between the third electrode E3 and the common electrode CE may be constant. thereby controlling the generation of a color shift to the light emitted by the first organic emission layer OL1, the second organic emission layer OL2, and the third organic emission layer OL3.

According to an exemplary embodiment, the first dent portion DP1, the second dent portion DP2, and the third dent portion DP3 of the first electrode E1, the second electrode E2, and the third electrode E3 respectively include a curved side dented in a 3D shape without a corner. The gap between the surface of the first electrode E1 and the common electrode CE may have a uniform first distance L1, the gap between the entire surface of the second electrode E2 and the common electrode CE may have a uniform second distance L2, and the gap between the entire surface of the third electrode E3 and the common electrode CE may have a constant third distance L3. Thus, all surfaces of the first organic emission layer OL1, the second organic emission layer OL2, and the third organic emission layer OL3 may be increased corresponding to the first dent portion DP1 of the first electrode E1, the second dent portion DP2 of the second electrode E2, and the third dent portion DP3 of the third electrode E3. The light emitted by the first organic emission layer OL1, the second organic emission layer OL2, and the third organic emission layer OL3 may be reflected in various directions by the first dent portion DP1 of the first electrode E1, the second dent portion DP2 of the second electrode E2, and the third dent portion DP3 of the third electrode E3, thereby improving the emission efficiency of light emitted by the first organic emission layer OL1, the second organic emission layer OL2, and the third organic emission layer OL3.

According to an exemplary embodiment, the first dent portion DP1, the second dent portion DP2, and the third dent portion DP3 of the first electrode E1, the second electrode E2, and the third electrode E3 respectively include a curved side dented in a 3D shape without a corner. The gap between the surface of the first electrode E1 and the common electrode CE may have a uniform first distance L1. The gap between the surface of the second electrode E2 and the common electrode CE may have a uniform second distance L2. The gap between the surface of the third electrode E3 and the common electrode CE may have a uniform third distance L3. Thus, when the respective areas of the first opening OA1, the second opening OA2, and the third opening OA3 are reduced by the processing error, all surfaces of the first organic emission layer (OL1), the second organic emission layer (OL2), and the third organic emission layer (OL3) are increased and the light emitted by the first organic emission layer (OL1), the second organic emission layer (OL2), and the third organic emission layer (OL3) may be reflected in various directions by the first dent portion DP1 of the first electrode E1, the second dent portion DP2 of the second electrode E2, and the third dent portion DP3 of the third electrode E3, thereby controlling deterioration of efficiency of light emitted by the first organic emission layer (OL1), the second organic emission layer (OL2), and the third organic emission layer (OL3) by the processing error.

According to an exemplary embodiment, the surfaces of the external portions of the first electrode E1, the second electrode E2, and the third electrode E3 covered by the pixel defining layer PDL may extend in parallel with the plate side of the substrate SUB. Thus, when respective parts of the pixel defining layer PDL neighboring the first opening OA1, the second opening OA2, and the third opening OA3 move to portions that are provided near the first dent portion DP1, the second dent portion DP2, and the third dent portion DP3 by processing error, the pixel defining layer PDL is controlled to cover the first dent portion DP1, the second dent portion DP2, or the third dent portion DP3. In other words, the first dent portion DP1, the second dent portion DP2, and the third dent portion DP3 are controlled to be provided on the edges of the first opening OA1, the second opening OA2, and the third opening OA3, thereby controlling the generation of a color shift to the light that is visible through the first opening OA1, the second opening OA2, and the third opening OA3 from the first organic emission layer OL1, the second organic emission layer OL2, and the third organic emission layer OL3.

The substrate SUB of the OLED display according to an exemplary embodiment is flexible so the OLED display may be flexible. Since the OLED display is flexible, when the OLED display is bent and the viewing angle is changed, the first dent portion DP1, the second dent portion DP2, and the third dent portion DP3 may respectively include a curved side dented in a 3D shape without a corner. The gap between the surfaces of the first electrode E1, the second electrode E2, and the third electrode E3 and the common electrode CE may have a uniform distance, and the distances between the common electrode CE and the first electrode E1 facing the viewing angle, the second electrode E2, and the third electrode E3 may be maintained thereby controlling the generation of a color shift to the light emitted by the first organic emission layer OL1, the second organic emission layer OL2, and the third organic emission layer OL3.

In other words, the OLED display with flexibility may exhibit improved display quality.

According to an exemplary embodiment, when considering that the first opening OA1 has a smaller area than the second opening OA2 and third opening OA3 corresponding to the wavelength of the light emitted by the first organic emission layer OL1, the second organic emission layer OL2, and the third organic emission layer OL3, the first dent portion DP1 is formed to have a different size from the second dent portion DP2 and the third dent portion DP3 so the light emitted by the first organic emission layer OL1, the second organic emission layer OL2, and the third organic emission layer OL3 corresponding to the first opening OA1, the second opening OA2, and the third opening OA3 is reflected with greatest efficiency by the first dent portion DP1, the second dent portion DP2, and the third dent portion DP3, thereby improving the emission efficiency of the light emitted by the first organic emission layer OL1, the second organic emission layer OL2, and the third organic emission layer OL3.

In other words, the OLED display with improved display quality is provided considering the wavelengths of the light emitted by the first organic emission layer OL1, the second organic emission layer OL2, and the third organic emission layer OL3.

An OLED display according to an exemplary embodiment will now be described with reference to FIG. 8 and FIGS. 9A-9D. For brevity and clarity, the description of FIGS. 8 and 9A-9D will focus on the differences between the OLED displays previously described and the OLED displays of FIGS. 8 and 9A-9D.

Figure 8:
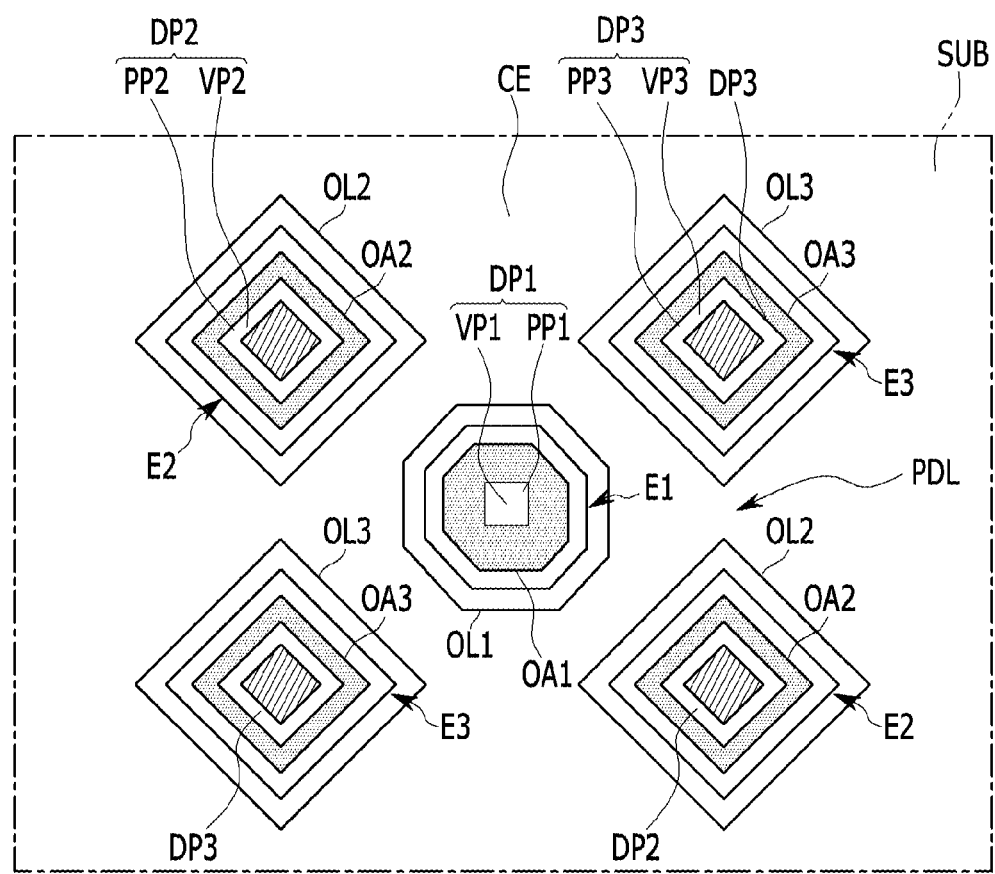
FIG. 8 is a plan view of an OLED display according to an exemplary embodiment.

FIG. 8 is a plan view of an OLED display according to an exemplary embodiment.

As shown in FIG. 8, a second dent portion DP2 of a second electrode E2 and a third dent portion DP3 of a third electrode E3 of an OLED display according to an exemplary embodiment respectively have a closed loop shape when viewed from a plan view perspective.

According to an exemplary embodiment, a first dent portion DP1 of a first electrode E1 has a closed loop shape when view from a plan view perspective. The first dent portion DP1 of the first electrode E1, the second dent portion DP2 of the second electrode E2, and the third dent portion DP3 of the third electrode E3 may respectively have a ring shape of various polygons, when viewed from a plan view perspective.

Forms of the first dent portion, the second dent portion, and the third dent portion of the first electrode, the second electrode, and the third electrode of an OLED display according to an exemplary embodiment will now be described in detail with reference to FIG. 9A, FIG. 9B, FIG. 9C, and FIG. 9D.

Figure 9A:
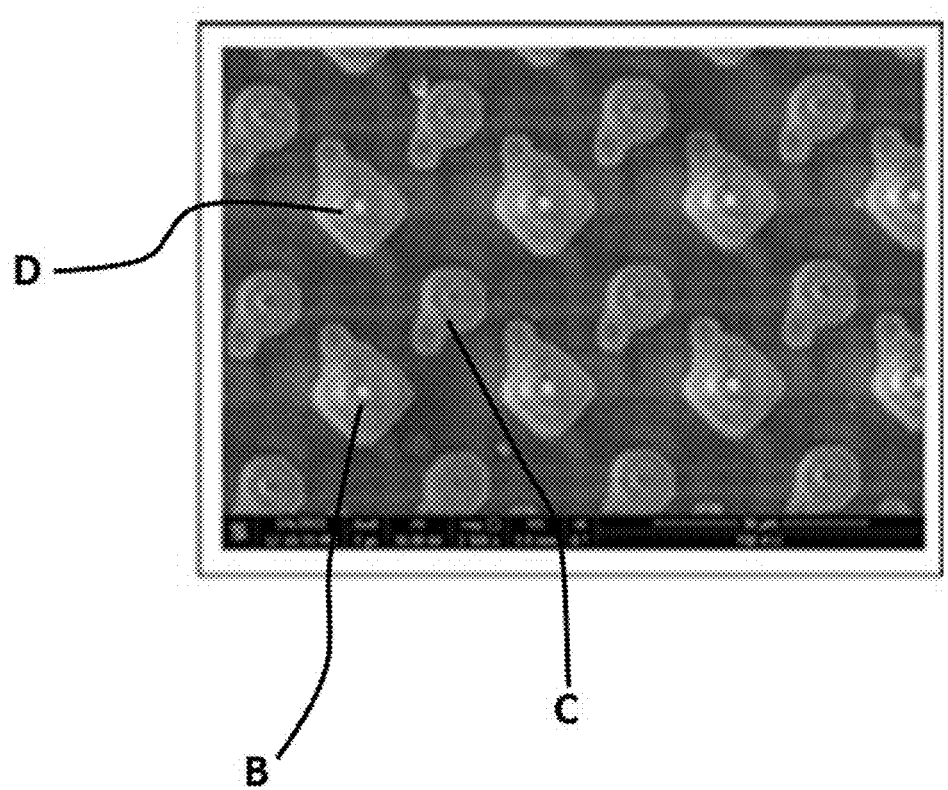
FIG. 9A is a photograph of a plan view of an OLED display according to an exemplary embodiment.
Figure 9B:
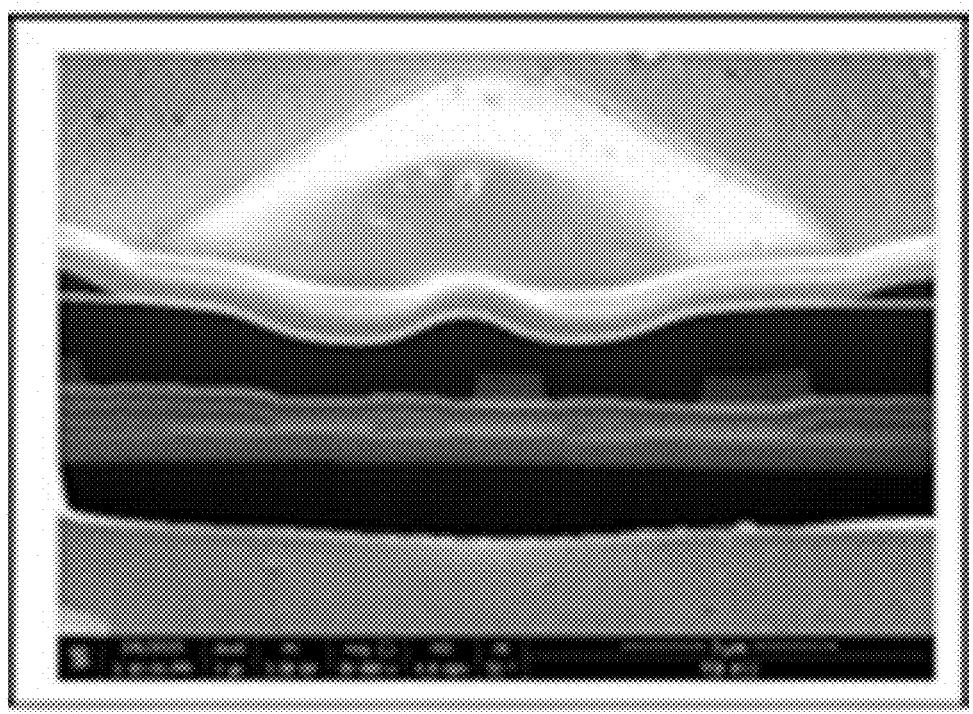
FIG. 9B is a photograph of a cross-section of B shown in FIG. 9A.
Figure 9C:
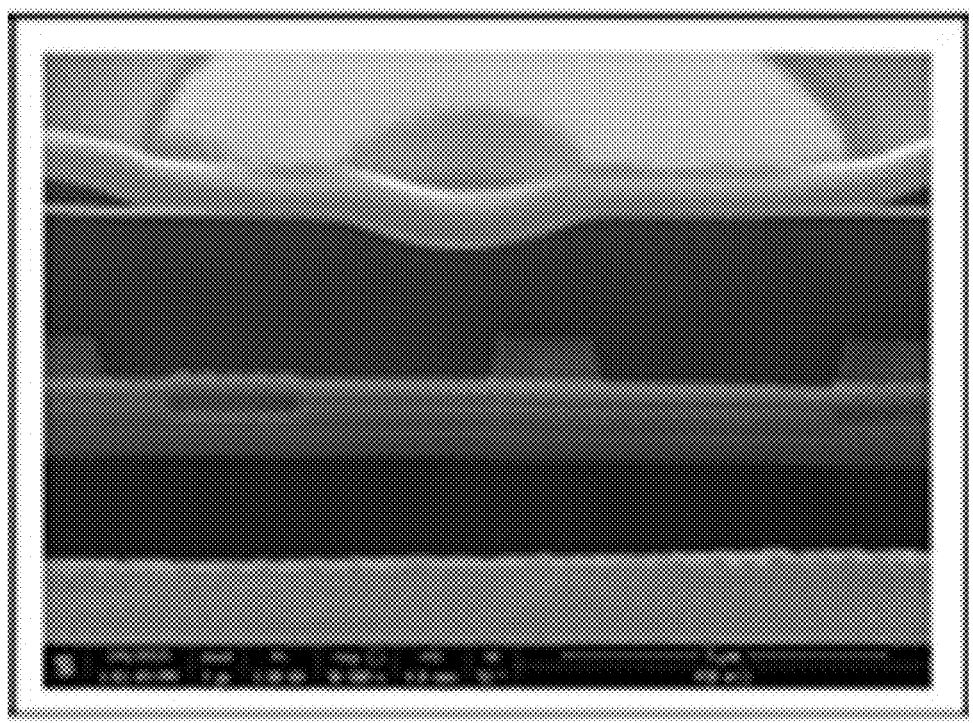
FIG. 9C is a photograph of a cross-section of C shown in FIG. 9A.
Figure 9D:
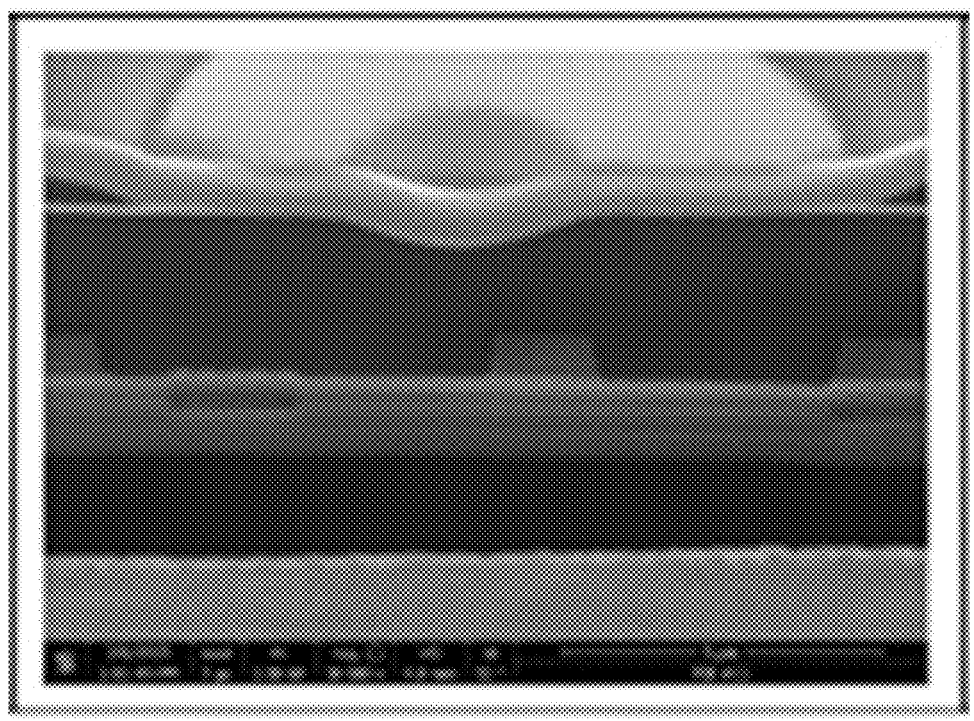
FIG. 9D is a photograph of a cross-section of D shown in FIG. 9A.

FIG. 9A is a photograph of a plan view of an OLED display according to an exemplary embodiment. FIG. 9B is a photograph of a cross-section of B shown in FIG. 9A. FIG. 9C is a photograph of a cross-section of C shown in FIG. 9A. FIG. 9D is a photograph of a cross-section of D shown in FIG. 9A. In FIG. 9A, B is a third electrode, C is a first electrode, and D is a second electrode.

As shown in FIG. 9A and FIG. 9C, the first dent portion of the first electrode of an OLED display according to an exemplary embodiment is dented in a 3D shape. In other words, the first dent portion may include a curved side dented in a 3D shape without a corner.

As shown in FIG. 9A and FIG. 9D, the second dent portion of the second electrode of an OLED display according to an exemplary embodiment is dented in a 3D shape. In other words, the second dent portion may include a curved side dented in a 3D shape without a corner.

As shown in FIG. 9A and FIG. 9B, the third dent portion of the third electrode of OLED display according to an exemplary embodiment is dented in a 3D shape. In other words, the third dent portion includes a curved side dented in a 3D shape without a corner.

In an exemplary embodiment, the first dent portion DP1, the second dent portion DP2, and the third dent portion DP3 of the first electrode E1, the second electrode E2, and the third electrode E3 respectively include a curved side dented in a 3D shape without a corner, and the second dent portion DP2 and the third dent portion DP3 respectively have a closed loop shape on the floor plan, thereby controlling the generation of a color shift of the light emitted by the first organic emission layer OL1, the second organic emission layer OL2, and the third organic emission layer OL3, improving the emission efficiency of the light emitted by the first organic emission layer OL1, the second organic emission layer OL2, and the third organic emission layer OL3, and controlling the deterioration of the efficiency of the light emitted by the first organic emission layer OL1, the second organic emission layer OL2, and the third organic emission layer OL3 by processing error.

In other words, the OLED display may have improved display quality when compared to conventional OLED displays.

Regarding the OLED display according to an exemplary embodiment, considering that the second opening OA2 and the third opening OA3 have a greater size than the first opening OA1 corresponding to the wavelengths of the light emitted by the first organic emission layer OL1, the second organic emission layer OL2, and the third organic emission layer OL3, the second dent portion DP2 and the third dent portion DP3 are formed to have a closed loop shape when viewed from a plan view perspective compared to the first dent portion DP1, so the light emitted by the first organic emission layer OL1, the second organic emission layer OL2, and the third organic emission layer OL3 corresponding to the first opening OA1, the second opening OA2, and the third opening OA3 is reflected with maximum efficiency by the first dent portion DP1, the second dent portion DP2, and the third dent portion DP3, thereby improving the emission efficiency of the light emitted by the first organic emission layer OL1, the second organic emission layer OL2, and the third organic emission layer OL3.

In other words, an OLED display with improved display quality is provided considering the wavelengths of the light emitted by the first organic emission layer OL1), the second organic emission layer OL2, and the third organic emission layer OL3.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting diode display, comprising:
   a substrate;
   a first electrode disposed on the substrate, the first electrode comprising a first dent portion;
   a second electrode disposed on the substrate and separated from the first electrode, the second electrode comprising a second dent portion having a different size from the first dent portion;
   a pixel defining layer disposed on the first electrode and the second electrode, the pixel defining layer comprising a first opening exposing the first electrode corresponding to the first dent portion and a second opening exposing the second electrode corresponding to the second dent portion;
   a first organic emission layer disposed on the first electrode corresponding to the first opening;
   a second organic emission layer disposed on the second electrode corresponding to the second opening;
   a common electrode disposed on the first organic emission layer and the second organic emission layer; and
   a third electrode disposed on the substrate and separated from the first electrode and the second electrode, the third electrode comprising a third dent portion having a size different from the first dent portion; and
   a third organic emission layer disposed on the third electrode,
   wherein the pixel defining layer further comprises a third opening for exposing the third electrode corresponding to the third dent portion, the third organic emission layer being disposed in the third opening.

2. The organic light emitting diode display of claim 1, wherein the first opening has a smaller area than the second opening.

3. The organic light emitting diode display of claim 2, wherein the first dent portion has an area smaller than the second dent portion.

4. The organic light emitting diode display of claim 2, wherein the first dent portion has a smaller volume than the second dent portion.

5. The organic light emitting diode display of claim 1, wherein the first dent portion comprises:
   a first valley portion; and
   a surface having a curved shape and extending from the first valley portion to a first peak portion, the first peak portion surrounding the first valley portion.

6. The organic light emitting diode display of claim 1, wherein the second dent portion comprises:
   a second valley portion; and
   a surface having a curved shape and extending from the second valley portion to a second peak portion, the second peak portion surrounding the second valley portion.

7. The organic light emitting diode display of claim 1, wherein a distance between a surface of the first electrode and the common electrode is a uniform first distance in a direction that is perpendicular to a plate side of the substrate.

8. The organic light emitting diode display of claim 1, wherein a distance between a surface of the second electrode and the common electrode is a uniform second distance in a direction that is perpendicular to a plate side of the substrate.

9. The organic light emitting diode display of claim 1, wherein the second electrode comprises multiple second dent portions that are separated from each other.

10. The organic light emitting diode display of claim 1, wherein the second dent portion has a closed loop shape when viewed from a plan view perspective.

11. The organic light emitting diode display of claim 1, further comprising an insulating layer disposed between the substrate and the first electrode, the insulating layer comprising a dented portion corresponding to the first dent portion.

12. The organic light emitting diode display of claim 1, wherein:
   the first organic emission layer is configured to emit light with a first wavelength,
   the second organic emission layer is configured to emit light with a second wavelength that is less than the first wavelength, and
   the third organic emission layer is configured to emit light with a third wavelength that is greater than the first wavelength.

13. An organic light emitting diode display, comprising:
   a substrate;
   a first electrode disposed on the substrate, the first electrode comprising a first dent portion with a curved side;
   a second electrode disposed on the substrate and separated from the first electrode, the second electrode comprising a second dent portion;
   a third electrode disposed on the substrate and separated from the first electrode and the second electrode, the third electrode comprising a third dent portion having a size different from the first dent portion;
   a pixel defining layer disposed on the first electrode, second electrode, and third electrode the pixel defining layer comprising a first opening for exposing the first electrode corresponding to the first dent portion, a second opening for exposing the second electrode corresponding to the second dent portion, and a third opening for exposing the third electrode;

a first organic emission layer disposed on the first electrode corresponding to the first opening;
a second organic emission layer disposed on the second electrode
a third organic emission layer disposed on the third electrode; and
a common electrode disposed on the first organic emission layer.

14. The organic light emitting diode display of claim 13, wherein the first dent portion comprises:
a valley portion; and
a surface having a curved side that extends from the valley portion to a peak portion and the peak portion surrounds the valley portion.

15. The organic light emitting diode display of claim 13, wherein the curved side has a sine wave cross-sectional shape.

16. The organic light emitting diode display of claim 13, wherein a surface of the first dent portion is formed as the curved side.

17. The organic light emitting diode display of claim 13, wherein a distance between a surface of the first electrode and the common electrode is uniform in a direction that is perpendicular to a plate side of the substrate.

18. The organic light emitting diode display of claim 13, wherein:
the pixel defining layer covers an external portion of the first electrode, and
a surface of the external portion of the first electrode extends in parallel with a plate side of the substrate.

19. The organic light emitting diode display of claim 13, wherein the substrate is flexible.

* * * * *